United States Patent
Jewula et al.

(10) Patent No.: US 12,081,199 B2
(45) Date of Patent: Sep. 3, 2024

(54) SURFACE ACOUSTIC WAVE (SAW) DEVICE WITH ONE OR MORE INTERMEDIATE LAYERS FOR SELF-HEATING IMPROVEMENT

(71) Applicant: RF360 Singapore Pte. Ltd., Singapore (SG)

(72) Inventors: Tomasz Jewula, Bavaria (DE); Matthias Honal, Bavaria (DE)

(73) Assignee: RF360 Singapore Pte. Ltd., Singapore (SG)

( * ) Notice: Subject to any disclaimer, the term of this patent is extended or adjusted under 35 U.S.C. 154(b) by 276 days.

(21) Appl. No.: 17/647,953

(22) Filed: Jan. 13, 2022

(65) Prior Publication Data
US 2023/0223918 A1   Jul. 13, 2023

(51) Int. Cl.
*H03H 9/64* (2006.01)
*H03H 3/08* (2006.01)
*H03H 9/02* (2006.01)
*H03H 9/145* (2006.01)

(52) U.S. Cl.
CPC ............ *H03H 9/64* (2013.01); *H03H 3/08* (2013.01); *H03H 9/02834* (2013.01); *H03H 9/02992* (2013.01); *H03H 9/14541* (2013.01)

(58) Field of Classification Search
CPC ........ H03H 9/08; H03H 9/0585; H03H 9/058; H03H 9/0576; H03H 3/08; H03H 9/64
USPC ......................................... 333/186, 193, 194
See application file for complete search history.

(56) References Cited

U.S. PATENT DOCUMENTS

| | | | |
|---|---|---|---|
| 4,775,814 A | * | 10/1988 | Yuhara ..................... H03H 3/08 310/313 R |
| 6,377,138 B1 | * | 4/2002 | Takagi ............... H03H 9/02929 333/195 |
| 7,034,435 B2 | | 4/2006 | Hakamada |
| 7,504,760 B2 | | 3/2009 | Fujimoto et al. |

(Continued)

FOREIGN PATENT DOCUMENTS

WO    2021085465 A1    5/2021

OTHER PUBLICATIONS

Choi G., et al., "Study on Thermal Conductivity and Electrical Resistivity of Al—Cu Alloys Obtained by Boltzmann Transport Equation and First-principles Simulation: Semi-empirical Approach", Journal of Alloys and Compounds, Elsevier Sequoia, Lausanne, CH, vol. 727, Aug. 24, 2017, pp. 1237-1242, XP085207201, ISSN: 0925-8388, figure 3 (b).

(Continued)

*Primary Examiner* — Rakesh B Patel
(74) *Attorney, Agent, or Firm* — Patterson + Sheridan LLP (57) ABSTRACT

Certain aspects of the present disclosure provide a surface acoustic wave (SAW) device with one or more intermediate layers for reduced self-heating and methods for fabricating such a SAW device. One example SAW device generally includes a piezoelectric layer and an interdigital transducer (IDT) disposed above the piezoelectric layer. The IDT generally includes a first electrode having a first busbar and a first plurality of fingers. The first electrode generally includes a first copper layer disposed above the piezoelectric layer, a first intermediate layer disposed above the first copper layer, the first intermediate layer comprising a different material than the first copper layer, and a second copper layer disposed above the first intermediate layer.

29 Claims, 8 Drawing Sheets

(56) References Cited

U.S. PATENT DOCUMENTS

| | | | |
|---|---|---|---|
| 2006/0103486 A1* | 5/2006 | Ruile | H03H 9/02929 |
| | | | 333/133 |
| 2009/0206484 A1 | 8/2009 | Baker-O'Neal et al. | |
| 2013/0015744 A1 | 1/2013 | Adkisson et al. | |
| 2015/0123744 A1* | 5/2015 | Nishimura | H03H 9/0571 |
| | | | 310/365 |
| 2019/0260353 A1 | 8/2019 | Daimon et al. | |

OTHER PUBLICATIONS

International Search Report and Written Opinion—PCT/EP2022/086414—ISA/EPO—Apr. 4, 2023.

* cited by examiner

SURFACE ACOUSTIC WAVE (SAW) DEVICE WITH ONE OR MORE INTERMEDIATE LAYERS FOR SELF-HEATING IMPROVEMENT

TECHNICAL FIELD

Certain aspects of the present disclosure relate generally to electronic components and, more particularly, to surface acoustic wave (SAW) devices implemented with one or more intermediate layers for reduced self-heating.

BACKGROUND

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency of range of frequencies. Electroacoustic devices (e.g., "acoustic filters") are used for filtering high frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices such as cellular phones).

Today, surface acoustic wave (SAW) or bulk acoustic wave (BAW) components may be used in wireless communication devices, such as for implementing RF filters. In SAW technology, the acoustic wave propagates laterally on a surface of a piezoelectric substrate (or a piezoelectric layer in examples where there are additional layers below the piezoelectric layer), with the movement of the piezoelectric generated by metal interdigitated transducers (IDTs) on the surface. The wavelength of the acoustic wave may be defined by the pitch (e.g., the spacing between fingers, which may be defined as the width of the metal finger and gap from one edge of a finger to a corresponding edge on an adjacent finger) of the IDT. In BAW technology, the acoustic wave propagates vertically through a three-dimensional structure, with an electric field applied through electrodes above and below a piezoelectric material. The wavelength, in this case, is defined by the thickness of the piezoelectric material.

In one type of SAW device, a surface acoustic wave is generated by an input IDT and detected by an output IDT. In another type of SAW device, the acoustic energy may be confined using reflectors on either side of the IDT. A planar resonant cavity created between two mirrors consisting of reflecting metal strips can also be used to trap the acoustic energy.

As the number of frequency bands used in wireless communications increases and as the desired frequency band of filters widen, the performance of acoustic filters increases in importance to reduce losses and increase overall performance of electronic devices. Acoustic filters with improved performance, particularly filters with reduced mechanical losses and self-heating, are therefore sought after.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include implementation of one or more intermediate layers to limit copper grain growth in surface acoustic wave (SAW) technology to, for example, reduce mechanical losses and self-heating.

Certain aspects of the present disclosure are directed to a SAW device. The SAW device generally includes a piezoelectric layer and an interdigital transducer (IDT) disposed above the piezoelectric layer. The IDT includes a first electrode having a first busbar and a first plurality of fingers extending from the first busbar. The first electrode generally includes a first copper layer disposed above the piezoelectric layer, a first intermediate layer disposed above the first copper layer, the first intermediate layer comprising a different material than the first copper layer, and a second copper layer disposed above the first intermediate layer.

Certain aspects of the present disclosure are directed to a wireless device. The wireless device generally includes a radio frequency (RF) circuit and a SAW filter coupled to the RF circuit. The SAW filter generally includes a piezoelectric layer and an IDT disposed above the piezoelectric layer. The IDT includes a first electrode having a first busbar and a first plurality of fingers extending from the first busbar. The first electrode generally includes a first copper layer disposed above the piezoelectric layer, a first intermediate layer disposed above the first copper layer, the first intermediate layer comprising a different material than the first copper layer, and a second copper layer disposed above the first intermediate layer.

Certain aspects of the present disclosure are directed to a method for fabricating a SAW device. The method generally includes forming an IDT above a piezoelectric layer. Forming the IDT generally includes forming a first electrode of the IDT, the first electrode having a first busbar and a first plurality of fingers extending from the first busbar. Forming the first electrode generally includes forming a first copper layer above the piezoelectric layer, forming a first intermediate layer above the first copper layer, the first intermediate layer comprising a different material than the first copper layer, and forming a second copper layer above the first intermediate layer.

Certain aspects of the present disclosure are directed to a plurality of resonators forming a filter circuit. In this case, the SAW device described herein may be a resonator in the plurality of resonators.

Certain aspects of the present disclosure are directed to a SAW device. The SAW device generally includes a piezoelectric layer and an IDT disposed above the piezoelectric layer and comprising a first electrode having a first busbar and a first plurality of fingers extending from the first busbar. The first electrode generally includes a first copper layer disposed above the piezoelectric layer, means for interrupting grain growth in the first copper layer, disposed above the first copper layer, and a second copper layer disposed above the means for interrupting grain growth in the first copper layer.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to a surface acoustic wave (SAW) device with one or more intermediate layers formed between copper (Cu) layers of the busbars and fingers of an interdigital transducer (IDT). The one or more intermediate layers may inhibit copper grain growth, thereby reducing the grain sizes within the copper layers. The smaller grain sizes may result in reduced mechanical losses and self-heating, thereby improving compression behavior and power durability for the SAW device.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Example Electroacoustic Devices

Figure 1A:
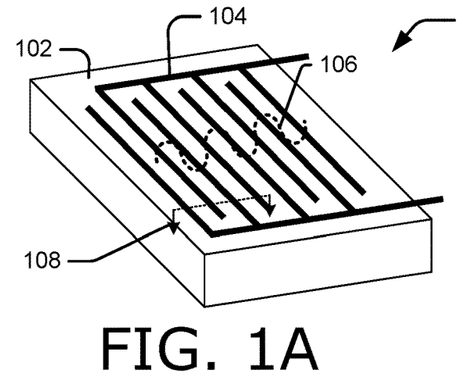
FIG. 1A is a perspective view of an example electroacoustic device, in which certain aspects of the present disclosure may be practiced.

FIG. 1A is a perspective view of an example electroacoustic device 100. The electroacoustic device 100 may be configured as or be a portion of a SAW resonator. In certain descriptions herein, the electroacoustic device 100 may be referred to as a SAW resonator. However, there may be other electroacoustic device types that may be constructed based on the principles described herein.

The electroacoustic device 100 includes an electrode structure 104, that may be referred to as an interdigital transducer (IDT), on the surface of a piezoelectric material 102. The electrode structure 104 generally includes first and second comb-shaped electrode structures (conductive and generally metallic) with electrode fingers extending from two busbars towards each other arranged in an interlocking manner in between the two busbars (e.g., arranged in an interdigitated manner). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars).

Figure 1B:
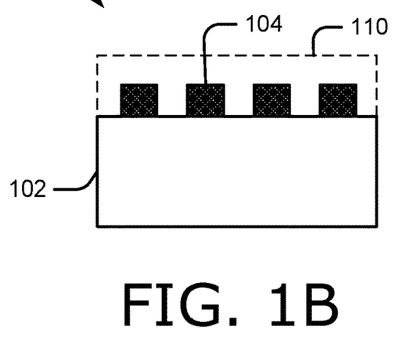
FIG. 1B is a cross-sectional view of the example electroacoustic device of FIG. 1A.

FIG. 1B is a cross-sectional view of the electroacoustic device 100 of FIG. 1A along a line segment 108 shown in FIG. 1A. The electroacoustic device 100 is illustrated by a simplified layer stack including the piezoelectric material 102 with the electrode structure 104 disposed on the piezoelectric material 102. The electrode structure 104 is electrically conductive and generally formed from metallic materials. The electrode structure 104 may alternatively be formed from materials that are electrically conductive, but non-metallic (e.g., graphene). The piezoelectric material 102 may be formed from a variety of materials such as quartz, lithium tantalate ($LiTaO_3$), lithium niobite ($LiNbO_3$), doped variants of these, other piezoelectric materials, or other crystals. The piezoelectric material 102 may be referred to as a "piezoelectric substrate," but may also be referred to as a "piezoelectric layer," such as in examples where there are additional layers below the piezoelectric material 102. It should be appreciated that more complicated layer stacks including layers of various materials may be possible within the stack. For example, optionally, a temperature compensation layer 110 denoted by the dashed lines may be disposed above the electrode structure 104. The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip-chip or other techniques) may also be included.

Figure 2A:
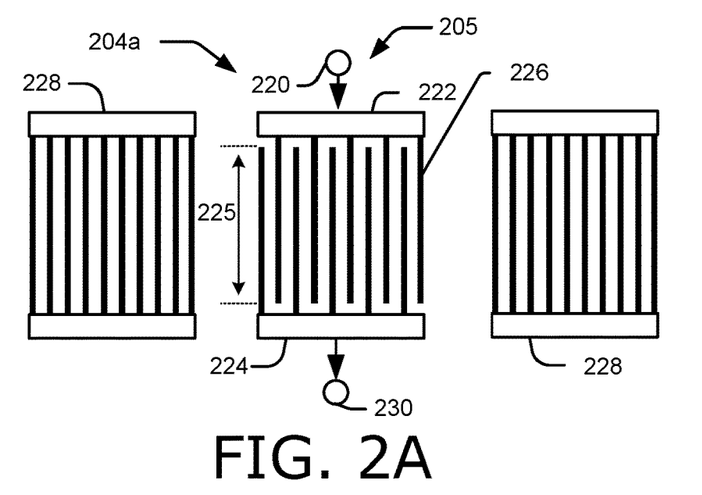
FIG. 2A is a top view of an example electrode structure of an electroacoustic device, in which certain aspects of the present disclosure may be practiced.

FIG. 2A is a top view of an example electrode structure 204a of an electroacoustic device. The electrode structure 204a has an IDT 205 that includes a first busbar 222 (e.g., first conductive segment or rail) electrically connected to a first terminal 220 and a second busbar 224 (e.g., second conductive segment or rail) spaced from the first busbar 222 and connected to a second terminal 230. A plurality of conductive fingers 226 are connected to either the first busbar 222 or the second busbar 224 in an interdigitated manner. Fingers 226 connected to the first busbar 222 extend towards the second busbar 224, but do not connect to the second busbar 224 so that there is a small gap between the ends of these fingers 226 and the second busbar 224. Likewise, fingers 226 connected to the second busbar 224 extend towards the first busbar 222, but do not connect to the first busbar 222 so that there is a small gap between the ends of these fingers 226 and the first busbar 222. Similarly, small gaps may also be formed between fingers 226 and any structure extending from the first busbar 222 or the second busbar 224 (e.g., stub fingers).

Between the busbars, there is an overlap region including a central region where a portion of one finger overlaps with a portion of an adjacent finger as illustrated by the central region 225. This central region 225 including the overlap may be referred to as the aperture, track, or active region where electric fields are produced between the fingers 226 to cause an acoustic wave to propagate in this region of the piezoelectric material 102. The periodicity of the fingers 226 is referred to as the pitch of the IDT. The pitch may be indicated in various ways. For example, in certain aspects, the pitch may correspond to a magnitude of a distance between fingers in the central region 225. This distance may be defined, for example, as the distance between center points of each of the fingers (and may be generally measured between a right (or left) edge of one finger and the right (or left) edge of an adjacent finger when the fingers have uniform width). In certain aspects, an average of distances between adjacent fingers may be used for the pitch. The frequency at which the piezoelectric material vibrates is a main resonance frequency of the electrode structure 204a. This frequency is determined at least in part by the pitch of the IDT 205 and other properties of the electroacoustic device 100.

The IDT 205 is arranged between two reflectors 228 which reflect the acoustic wave back towards the IDT 205 for the conversion of the acoustic wave into an electrical signal via the IDT 205 in the configuration shown and to prevent losses (e.g., confine and prevent escaping acoustic waves). Each reflector 228 has two busbars and a grating structure of conductive fingers that each connect to both busbars. The pitch of the reflector may be similar to or the same as the pitch of the IDT 205 to reflect acoustic waves in the resonant frequency range. But many configurations are possible.

When converted back to an electrical signal, the converted electrical signal may be provided as an output, such as to one of the first terminal 220 or the second terminal 230, while the other terminal may function as an input.

A variety of electrode structures are possible. FIG. 2A may generally illustrate a one-port configuration. Other configurations (e.g., two-port configurations) are also possible. For example, the electrode structure 204a may have an input IDT 205 where each terminal 220 and 230 functions as an input. In this event, an adjacent output IDT (not illustrated) that is positioned between the reflectors 228 and adjacent to the input IDT 205 may be provided to convert the acoustic wave propagating in the piezoelectric material 102 to an electrical signal to be provided at output terminals of the output IDT.

Figure 2B:
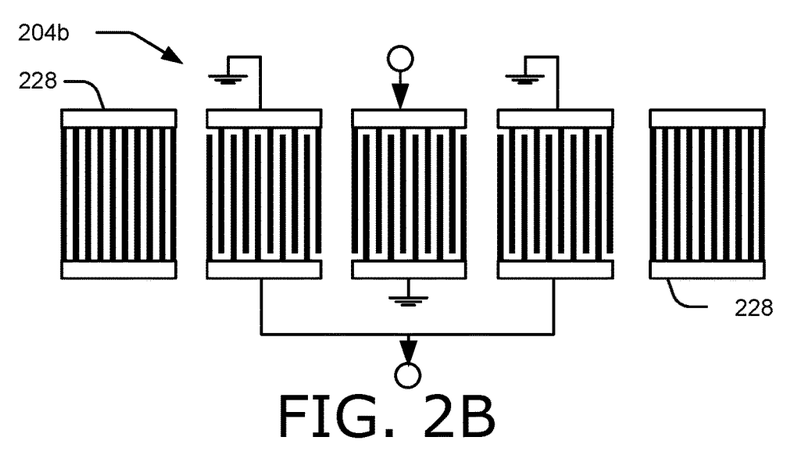
FIG. 2B is a top view of another example electrode structure of an electroacoustic device, in which certain aspects of the present disclosure may be practiced.

FIG. 2B is a top view of another example electrode structure 204b of an electroacoustic device. In this case, a dual-mode SAW (DMS) electrode structure 204b is illustrated, the DMS structure being a structure that may induce multiple resonances. The electrode structure 204b includes multiple IDTs arranged between reflectors 228 and connected as illustrated. The electrode structure 204b is provided to illustrate the variety of electrode structures that principles described herein may be applied to including the electrode structures 204a and 204b of FIGS. 2A and 2B.

It should be appreciated that while a certain number of fingers 226 are illustrated, the number of actual fingers and length(s) and width(s) of the fingers 226 and busbars may be different in an actual implementation. Such parameters depend on the particular application and desired filter characteristics. In addition, a SAW filter may include multiple interconnected electrode structures each including multiple IDTs to achieve a desired passband (e.g., multiple interconnected resonators or IDTs to form a desired filter transfer function).

Figure 3:
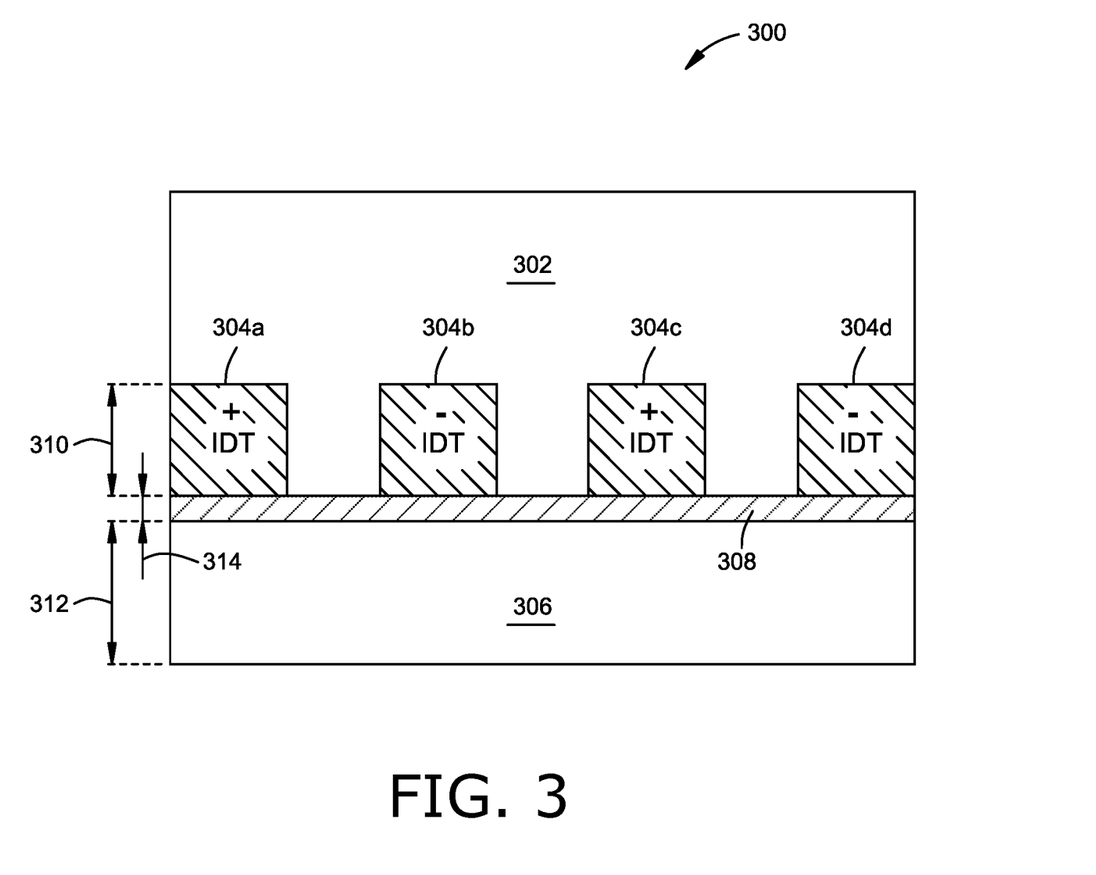
FIG. 3 is a cross-sectional view of an example electroacoustic device with a continuous thin layer of a dielectric material deposited on a piezoelectric layer prior to electrode deposition.

FIG. 3 is a cross-sectional view of an example electroacoustic device 300. The electroacoustic device 300 includes an IDT comprising a first electrode having a first plurality of fingers 304a and 304c, and a second electrode having a second plurality of fingers 304b and 304d that are interdigitated with the first plurality of fingers 304a and 304c of the first electrode. As shown, the plurality of fingers 304a and 304c of the first electrode have polarity opposite that of the plurality of fingers 304b and 304d of the second electrode. The plurality of fingers 304a-d of the IDT have a height 310, which may be between 80 nm to 500 nm, for example. Although only four fingers 304a-d are shown in FIG. 3 to illustrate the concept, it is to be understood that the IDT may include more or less than four fingers.

A material 302 may be disposed above and between the fingers 304a-d of the IDT. The material 302 may be air, for example, when the electroacoustic device 300 is a standard SAW device. Alternatively, the material 302 may be a dielectric material such as silicon dioxide ($SiO_2$) if the electroacoustic device 300 is a temperature-compensated surface acoustic wave (TCSAW) device. The material 302 may have a low relative permittivity (e.g., $\varepsilon_r=1$ for air and $\varepsilon_r=3.9$ for $SiO_2$).

The electroacoustic device 300 (e.g., that may be configured as or be a part of a SAW resonator) is similar to the electroacoustic device 100 of FIG. 1A, but has a different layer stack. In particular, the electroacoustic device 300 includes a continuous thin dielectric layer 308 that is provided on (or at least above) a piezoelectric layer 306 having a height 312. For other aspects, the dielectric layer 308 may be absent. The piezoelectric layer 306, for example, may comprise lithium tantalate ($LiTaO_3$), lithium niobite ($LiNbO_3$), some doped variant thereof, or any other suitable material. The piezoelectric layer 306 may also include other layers, such as a substrate material or other layers below the piezoelectric layer 306.

As shown in FIG. 3, the dielectric layer 308 has a height 314, which may also be referred to as a thickness. It may be desirable to deposit the dielectric layer 308 in a very thin layer to avoid loss of coupling between the piezoelectric layer 306 and the fingers 304a-d of the electrodes. For example, the height 314 of the continuous dielectric layer 308 may be 2.5 nm. In general, the piezoelectric layer 306 may be substantially thicker than the dielectric layer 308 (e.g., potentially on the order of 20,000 to 200,000 times thicker as one example, or more). Additionally, the IDT electrode fingers 304a-d may be substantially thicker than the dielectric layer 308 (e.g., potentially on the order of up to 250 times thicker as one example). Stated another way, height 310 and height 312 may be substantially greater than height 314, by at least an order of magnitude.

According to certain aspects of the present disclosure, the electroacoustic device 300 may be implemented in a filter or duplexer of a radio frequency (RF) circuit for use in a wireless communications device. Such a wireless communications device is described in further detail in the description of FIGS. 6-8.

Example Electroacoustic Device with One or More Intermediate Layers Between Copper Layers of IDT Electrodes Electroacoustic devices such as SAW resonators are being designed to cover more frequency ranges (e.g., 500 MHz to 6 GHZ), to have higher bandwidths (e.g., up to 20%), and to have improved efficiency and performance. In general, SAW resonators exhibit mechanical losses that give rise to self-heating and insertion loss when operating under radio frequency (RF) power loading. This is caused by the high elastic energy density in the materials used to form SAW resonators (e.g., metal and dielectric materials). Viscoelastic losses caused by vibrations of edge dislocations can increase self-heating and insertion loss of the device. High self-heating can worsen the power durability and compression behavior of the device.

Notably, the grain size of copper layers (corresponding to the layer thickness) that form the electrodes of the IDT influences the mechanical losses and self-heating of a SAW resonator. Deposition methods exist that can produce small grain sizes, but subsequent annealing steps cause the grain size to increase later during production.

By forming one or more intermediate layers between the copper layers in a SAW device, however, grain growth within copper layers may be interrupted, thereby producing smaller grain sizes in the microcrystalline structure. The smaller grain sizes reduce the mechanical losses (e.g., the viscoelastic losses) and self-heating of the device (e.g., 30 to 40% self-heating reduction), and may also improve the small-signal performance of the device (e.g., reduced insertion loss, such as by 0.2 dB). Accordingly, in certain aspects of the present disclosure, electrodes (such as electrode fingers 304a-d) may comprise one or more intermediate layers disposed between adjacent copper layers (or between other conductive layers).

Figure 4A:
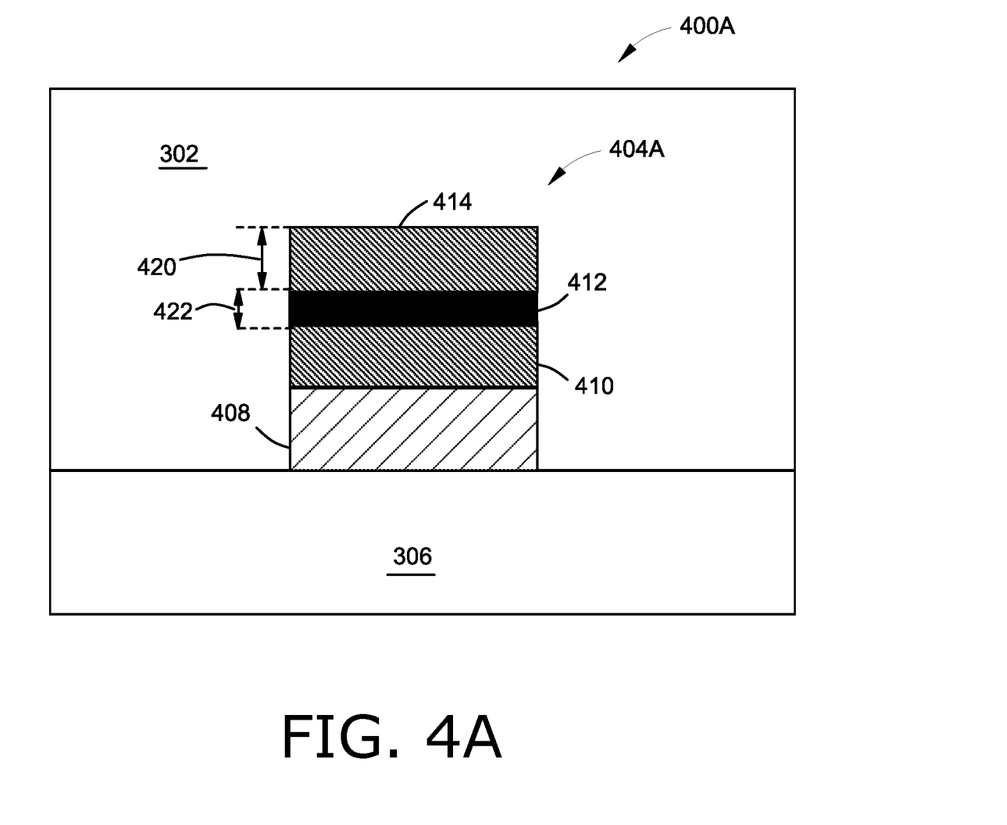
FIG. 4A is a cross-sectional view of an example electroacoustic device with an intermediate layer formed between copper layers, in accordance with certain aspects of the present disclosure.

FIG. 4A is a cross-sectional view of an example electroacoustic device 400A, in accordance with certain aspects of the present disclosure. The electroacoustic device 400A may be configured as or be a part of a SAW resonator. As shown, the electroacoustic device 400A may include an electrode finger 404A disposed above the piezoelectric layer 306. The electrode finger 404A may be one of a plurality of electrode fingers (such as electrode fingers 304a-d in FIG. 3) of electroacoustic device 400A.

In certain aspects, the electrode finger 404A may include an adhesion layer 408 disposed above the piezoelectric layer 306. The electrode finger 404A may also include a first copper layer 410 disposed above the piezoelectric layer 306, an intermediate layer 412 disposed above the first copper layer 410, and a second copper layer 414 disposed above the first intermediate layer 412. For certain aspects, the intermediate layer 412 may be located in a lower portion (e.g., a lower half) of the electrode finger 404A.

The adhesion layer 408 may generally be any material that promotes adhesion between the piezoelectric layer 306 and the first copper layer 410. For example, the adhesion layer 408 may be a layer of chromium (Cr), nickel (Ni), or titanium (Ti).

The intermediate layer 412 may most likely comprise a different material than the first copper layer 410. The intermediate layer 412 may serve to interrupt copper grain growth, thereby creating a microcrystalline structure in the first copper layer 410 and reducing mechanical losses and self-heating in the electroacoustic device 400A. As a result, the small signal performance in the electroacoustic device 400A may be improved. In order to interrupt copper grain growth, the intermediate layer 412 may be composed of a material that is insoluble to copper. For example, the intermediate layer 412 may comprise chromium (Cr), chromium silver (CrAg), tantalum (Ta), nickel (Ni), tungsten (W), a nitride, or a carbide. In certain aspects, it may be desirable for the intermediate layer 412 to comprise a material with a relatively low melting point (e.g., chromium or nickel). The lower melting point may aid in the production of the electroacoustic device 400A by, for example, making it easier to evaporate the material during a deposition process.

For certain aspects, each copper layer may have the same height (i.e., thickness), whereas in other aspects, the copper layers may have two or more different heights. The heights may be selected based on several factors including, but not limited to, the desired grain size and resistivity of the electroacoustic device 400A. As shown, the second copper layer 414 may have a height 420, which may be greater than a height 422 of intermediate layer 412. For example, the copper layers 410 and 414 may each have a height (corresponding to a grain size of each layer) that is at most 120 nm (e.g., a height or grain size of about 100 nm), while the intermediate layer 412 may have a height of less than 50 nm. In some examples, the intermediate layer 412 may have a height between 0.1 nm and 5.0 nm.

Additionally, a dielectric material 302 may be disposed above and along the sides of electrode finger 404A such that electrode finger 404A is encapsulated by the dielectric material 302. The electroacoustic device 400A may further include a second electrode having a second plurality of fingers interdigitated with the first plurality of fingers of the first electrode (e.g., as shown in FIGS. 1A, 2A, and 2B). Accordingly, the dielectric material 302 may be disposed above the piezoelectric layer 306, and above and between the first and second pluralities of fingers of the IDT.

In certain aspects, the electrode finger 404A may also include a cap layer (not shown) above the second copper layer 414. The cap layer may include any suitable material for separating the top of the second copper layer 414 from the dielectric material 302 and may be insoluble to copper (Cu). For example, the cap layer may comprise chromium (Cr).

Figure 4B:
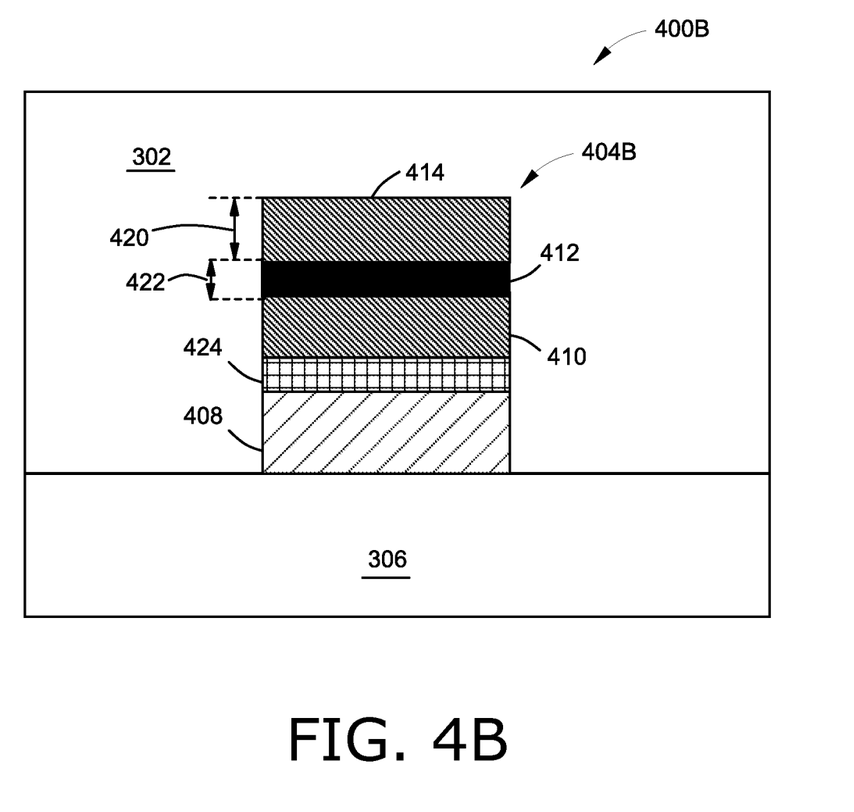
FIG. 4B is a cross-sectional view of an example electroacoustic device adding a silver layer below the copper layers of the device in FIG. 4A, in accordance with certain aspects of the present disclosure.

FIG. 4B is a cross-sectional view of an example electroacoustic device 400B, in accordance with certain aspects of the present disclosure. The electroacoustic device 400B may be similar to the electroacoustic device 400A in FIG. 4A. As shown, the electroacoustic device 400B may include an electrode finger 404B with a silver (Ag) layer 424 between the adhesion layer 408 and the first copper layer 410. In certain aspects, the silver layer 424 may be considered as part of the adhesion layer 408, or the silver layer 424 may be considered as a separate layer. The silver layer 424 may serve to stabilize the copper grain boundaries of the first copper layer 410 and improve the durability of the copper grain boundaries by minimizing, or at least reducing, boundary migration caused by external alternating mechanical stress.

Figure 4C:
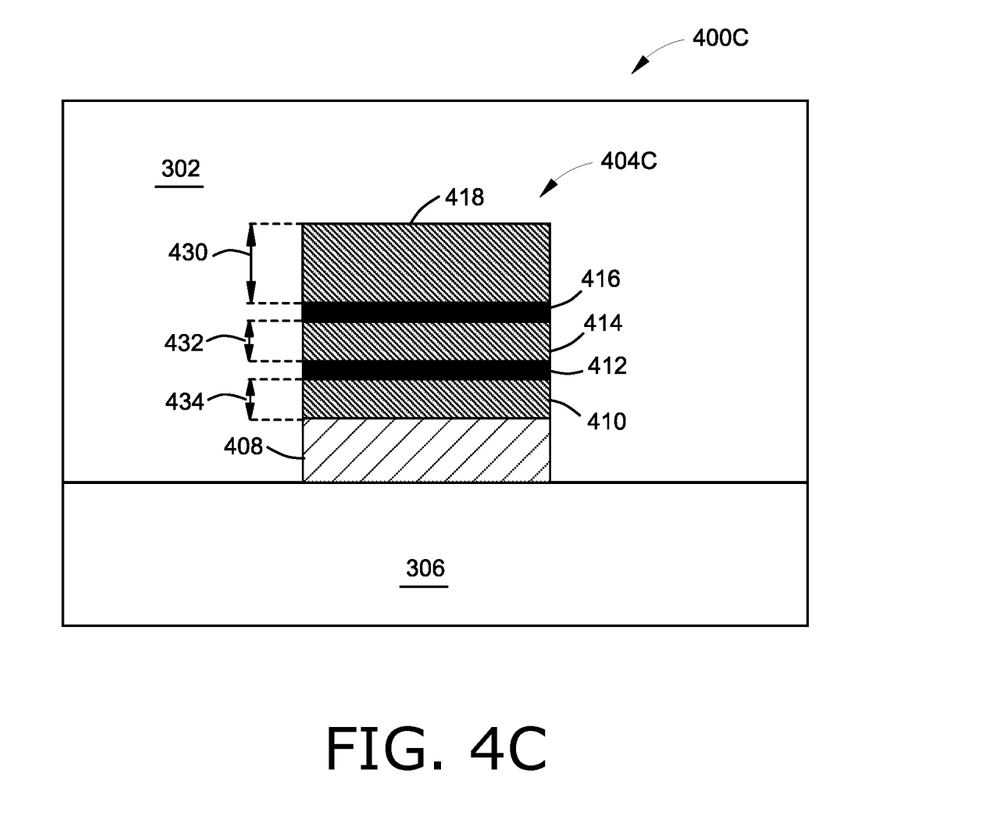
FIG. 4C is a cross-sectional view of an example electroacoustic device with multiple intermediate layers formed between copper layers, in accordance with certain aspects of the present disclosure.

Some electroacoustic devices may include more than one intermediate layer (e.g., two, three, or more intermediate layers, each intermediate layer disposed between a pair of copper (or other main electrode conductor) layers). For example, FIG. 4C is a cross-sectional view of an example electroacoustic device 400C, in accordance with certain aspects of the present disclosure. The electroacoustic device 400C may be similar to the electroacoustic devices 400A and 400B. As shown, the electroacoustic device 400C may include an electrode finger 404C disposed above the piezoelectric layer 306. In certain aspects, like electrode fingers 404A and 404B in FIGS. 4A and 4B, electrode finger 404C may include an adhesion layer 408, a first copper layer 410, a first intermediate layer 412, a second copper layer 414, and any additional layers described above (e.g., the silver layer 424 and/or the cap layer).

Electrode finger 404C may additionally include a second intermediate layer 416 disposed above the second copper layer 414. The second intermediate layer may be composed of a different material than the second copper layer. Furthermore, the second intermediate layer 416 may be composed of the same or a different material as the first intermediate layer 412. The second intermediate layer 416 may have the same or a different height as the first intermediate layer 412. In some examples, the heights of the first and second intermediate layers 412 and 416 may generally be less than the heights of the copper layers 410, 414, and 418. For example, the heights of the first and second intermediate layers 412 and 416 may be less than 50 nm. In some examples, the first and second intermediate layers 412 and 416 may each have a height between 0.1 nm and 5.0 nm.

Electrode finger 404C may also include a third copper layer 418 above the second intermediate layer 416. The third copper layer 418 may have a height 430, which may be greater than the height 432 and/or the height 434 of the first and second copper layers 410, 414, respectively. For example, the height 430 may be at least twice the height 432 and/or at least twice the height 434. This increased thickness of the third copper layer 418 may serve to reduce the resistivity of the electroacoustic device 400C.

It should be appreciated that, in certain aspects, the disclosed features of electrode fingers 404A, 404B, and 404C may additionally be implemented in one or more busbars of electroacoustic devices 400A, 400B, and 400C.

According to certain aspects, any of the electroacoustic devices 400A, 400B, and 400C may further include a second electrode having a second plurality of fingers interdigitated with the first plurality of fingers of the first electrode (e.g., as shown in FIGS. 1A, 2A, and 2B).

Figure 6:
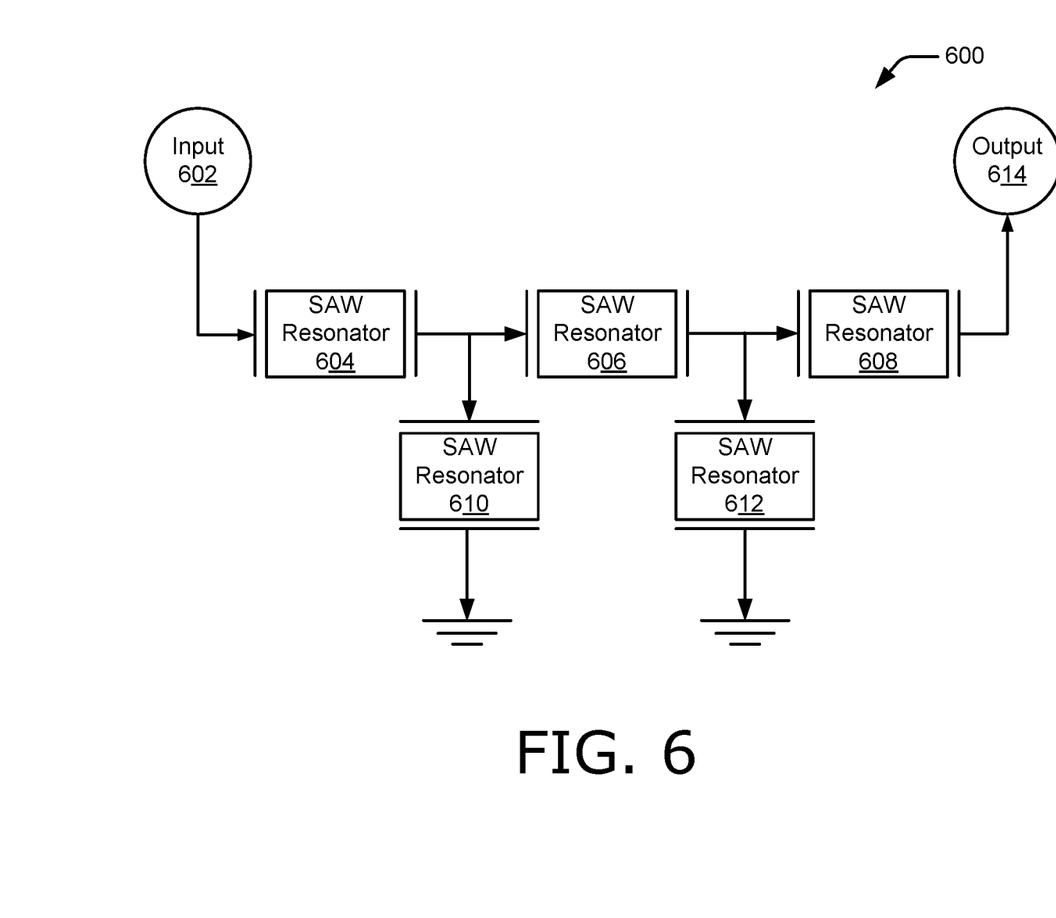
FIG. 6 is a schematic diagram of an electroacoustic filter circuit that may include one or more of the example electroacoustic devices of FIGS. 3, 4A, and/or 4B.

According to certain aspects, any of the electroacoustic devices 400A, 400B, and 400C may be a temperature-compensated SAW device (e.g., may include one or more temperature compensation layers, such as the dielectric material 302). Any of the electroacoustic devices 400A, 400B, and 400C may be configured for shear-wave excitation. According to certain aspects, any of the electroacoustic devices 400A, 400B, and 400C may be a resonator in the plurality of resonators (e.g., as shown in FIGS. 2B and 6).

Example Operations for Fabricating a SAW Device

Figure 5:
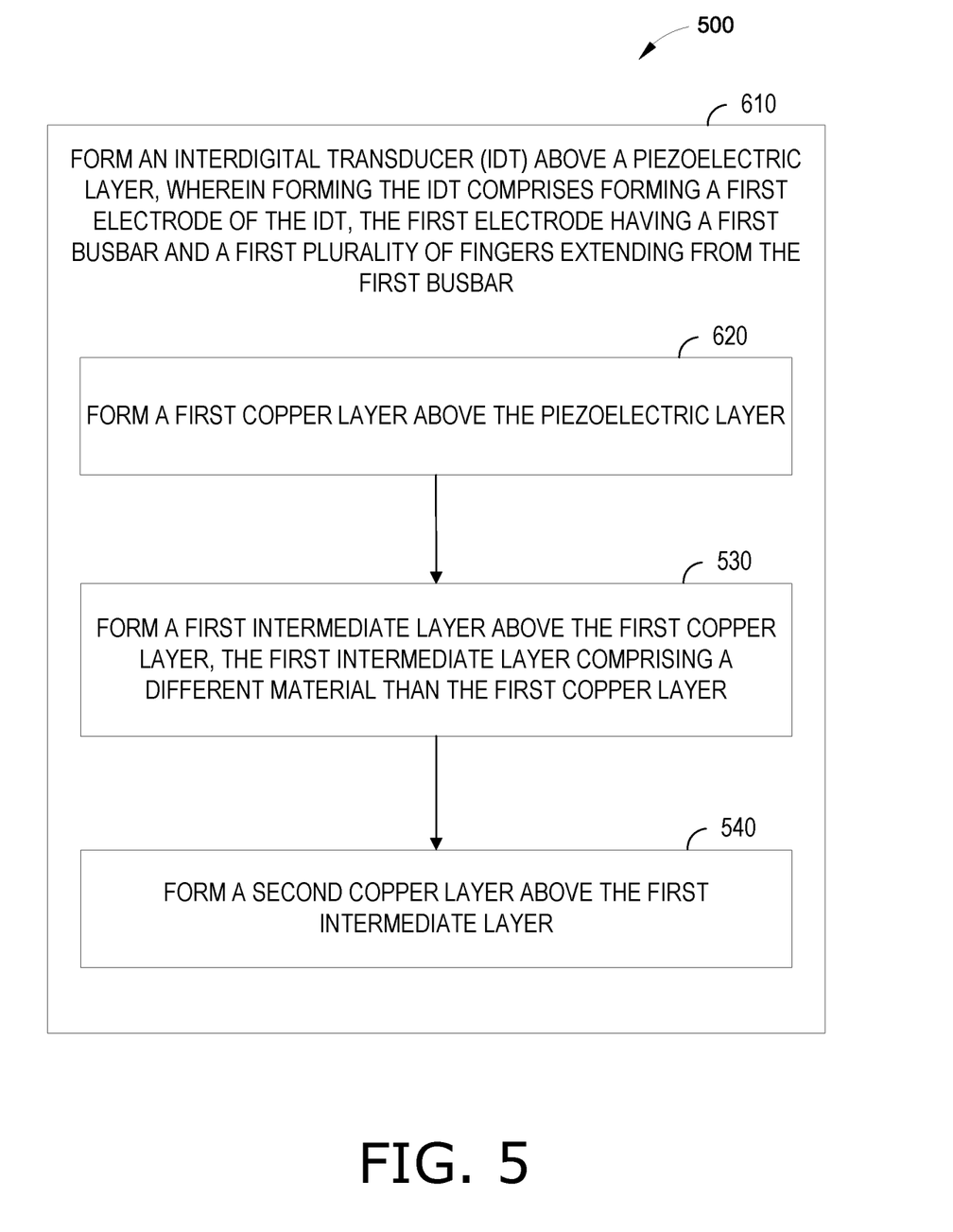
FIG. 5 is a flow diagram of example operations for forming a SAW device, in accordance with certain aspects of the present disclosure.

FIG. 5 is a block diagram of example operations 500 for fabricating a SAW device (e.g., the electroacoustic device 400A or 400B of FIG. 4A or 4B, respectively), in accordance with certain aspects of the present disclosure. The operations 500 are described in the form of a set of blocks that specify the operations that can be performed. However, operations are not necessarily limited to the order shown in FIG. 5 or described herein, for the operations may be implemented in alternative orders or in fully or partially overlapping manners. Also, more, fewer, and/or different operations may be implemented to perform the operations 500. The operations 500 may be performed, for example, by a semiconductor fabrication facility (also referred to as a "fab house").

The operations 500 may begin, at block 510, with the fabrication facility forming an IDT above a piezoelectric layer (e.g., piezoelectric layer 306). Forming the IDT at block 510 may include forming a first electrode (e.g., an electrode of electrode structure 104 or 204a) having a first busbar (e.g., the first busbar 222) and a first plurality of fingers (e.g., the fingers 226) extending from the first busbar.

Forming the first electrode may involve forming a first copper layer (e.g., the first copper layer 410) above the piezoelectric layer at block 520, forming a first intermediate layer (e.g., the first intermediate layer 412) above the first copper layer at block 530, and forming a second copper layer (e.g., the second copper layer 414) above the first intermediate layer at block 540. The first intermediate layer may comprise a different material than the first copper layer.

In certain aspects, forming the electrode may further include forming a second intermediate layer (e.g., the second intermediate layer 416), and forming a third copper layer (e.g., the third copper layer 418) above the second intermediate layer.

According to certain aspects, forming the first electrode may further involve forming a chromium layer above the piezoelectric layer. In this case, forming the first electrode may also include forming a silver layer disposed above the chromium layer, wherein the first copper layer is formed above the silver layer.

Each of the layers described above may be formed using any appropriate technique for producing electroacoustic devices. For example, the layers may by formed using e-beam evaporation and lift-off processes.

Example Integration into a Filter and Wireless Communications Device

FIG. 6 is a schematic diagram of an electroacoustic filter circuit 600 that may include one or more of the electroacoustic devices 300, 400A, and 400B of FIGS. 3, 4A, and 4B. The filter circuit 600 provides one example of where the disclosed SAW devices may be used. The filter circuit 600 includes an input terminal 602 and an output terminal 614. Between the input terminal 602 and the output terminal 614, a ladder-type network of SAW resonators is provided. The filter circuit 600 includes a first SAW resonator 604, a second SAW resonator 606, and a third SAW resonator 608 all electrically connected in series between the input terminal 602 and the output terminal 614. A fourth SAW resonator 610 (e.g., a shunt resonator) has a first terminal connected to a node between the first SAW resonator 604 and the second SAW resonator 606 and has a second terminal connected to a reference potential node (e.g., electric ground) for the filter circuit 600. A fifth SAW resonator 612 (e.g., a shunt resonator) has a first terminal connected to a node between the second SAW resonator 606 and the third SAW resonator 608 and has a second terminal connected to the reference potential node. The electroacoustic filter circuit 600 may, for example, be a bandpass filter circuit having a passband with a selected frequency range (e.g., in a range between 500 MHz and 6 GHZ).

Figure 7:
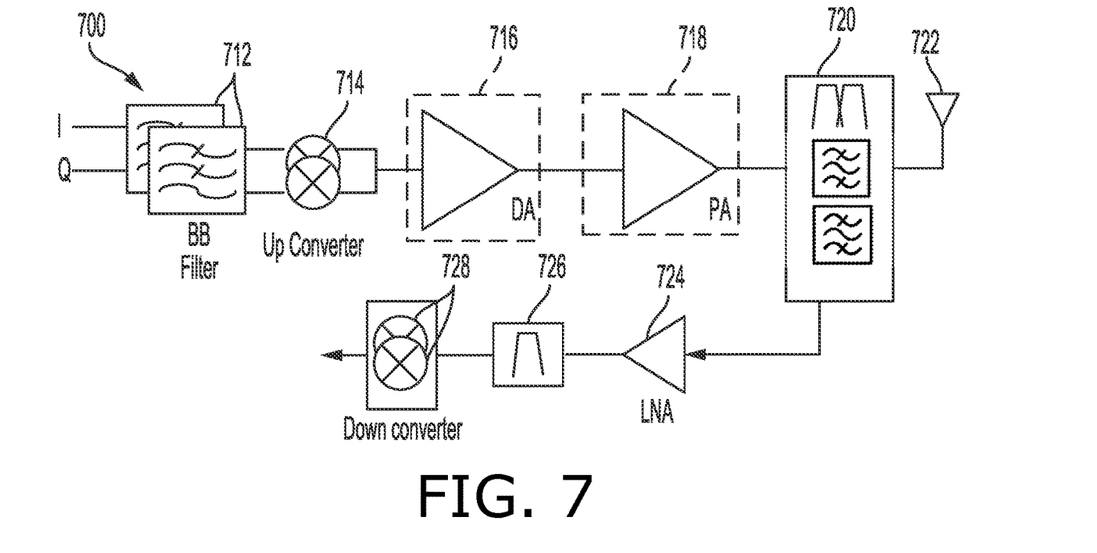
FIG. 7 is a functional block diagram of at least a portion of an example simplified wireless transceiver circuit in which the filter circuit of FIG. 6 may be employed.

FIG. 7 is a functional block diagram of at least a portion of an example simplified wireless transceiver circuit 700 in which the filter circuit 600 of FIG. 6 may be employed. The transceiver circuit 700 is configured to receive signals/information for transmission (shown as in-phase (I) and quadrature (Q) values) which is provided to one or more baseband (BB) filters 712. The filtered output is provided to one or more mixers 714 for upconversion to radio frequency (RF) signals. The output from the one or more mixers 714 may be provided to a driver amplifier (DA) 716 whose output may be provided to a power amplifier (PA) 718 to produce an amplified signal for transmission. The amplified signal is output to the antenna 722 through one or more filters 720 (e.g., duplexers if used as a frequency division duplex transceiver or other filters). The one or more filters 720 may include the filter circuit 600 of FIG. 6.

The antenna 722 may be used for both wirelessly transmitting and receiving data. The transceiver circuit 700 includes a receive path through the one or more filters 720 to be provided to a low noise amplifier (LNA) 724 and a further filter 726 and then downconverted from the receive frequency to a baseband frequency through one or more mixer circuits 728 before the signal is further processed (e.g., provided to an analog-to-digital converter (ADC) and then demodulated or otherwise processed in the digital domain). There may be separate filters for the receive circuit (e.g., may have a separate antenna or have separate receive filters) that may be implemented using the filter circuit 600 of FIG. 6.

Figure 8:
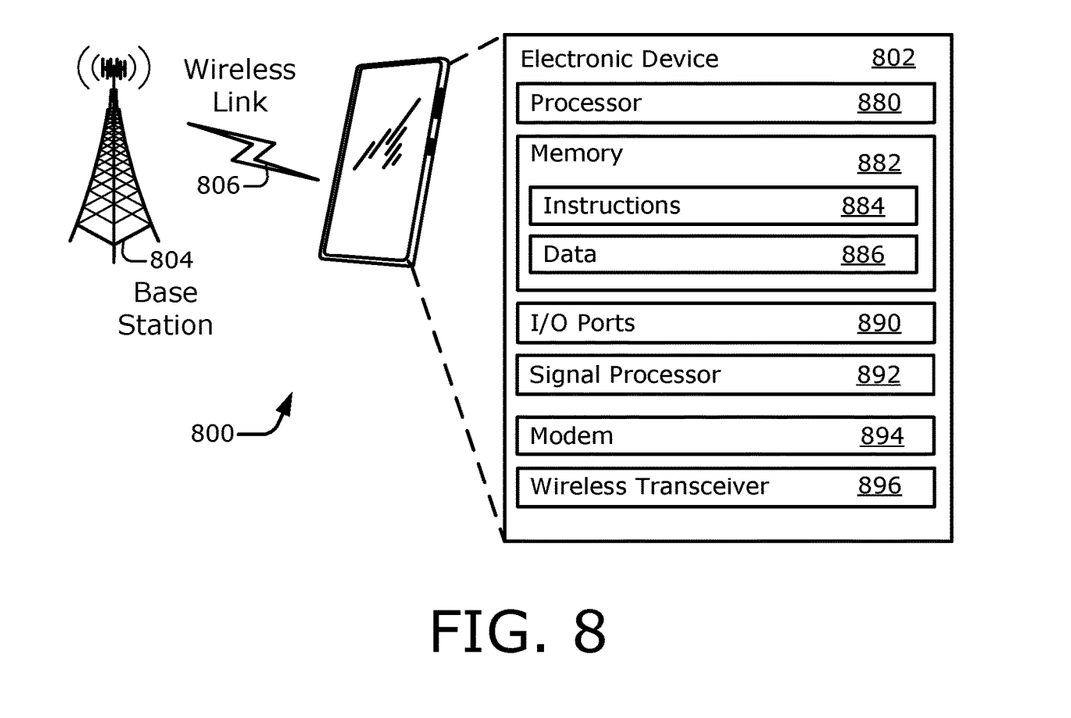
FIG. 8 is a diagram of an environment that includes an electronic device that includes a wireless transceiver such as the transceiver circuit of FIG. 7.

FIG. 8 is a diagram of an environment 800 that includes an electronic device 802, in which aspects of the present disclosure may be practiced. In the environment 800, the electronic device 802 communicates with a base station 804 (e.g., a gNB) through a wireless link 806. As shown, the electronic device 802 is depicted as a smartphone. However, the electronic device 802 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, wearable device, sensor or security device, asset tracker, and so forth.

The base station 804 communicates with the electronic device 802 via the wireless link 806, which may be implemented as any suitable type of wireless link. Although depicted as a base station tower of a cellular radio network, the base station 804 may represent or be implemented as another device, such as a satellite, terrestrial broadcast tower, access point, peer-to-peer device, mesh network node, fiber optic line, another electronic device generally as described above, and so forth. Hence, the electronic device 802 may communicate with the base station 804 or another device via a wired connection, a wireless connection, or a combination thereof. The wireless link 806 can include a downlink of data or control information communicated from the base station 804 to the electronic device 802 and an uplink of other data or control information communicated from the electronic device 802 to the base station 804. The wireless link 806 may be implemented using any suitable communication protocol or standard, such as 3rd Generation Partnership Project Long-Term Evolution (3GPP LTE), 3GPP NR 5G, IEEE 802.11, IEEE 802.16, Bluetooth™, and so forth.

The electronic device 802 includes a processor 880 and a memory 882. The memory 882 may be or form a portion of a computer-readable storage medium. The processor 880 may include any type of processor, such as an application processor or a multi-core processor, that is configured to execute processor-executable instructions (e.g., code) stored by the memory 882. The memory 882 may include any suitable type of data storage media, such as volatile memory (e.g., random access memory (RAM)), non-volatile memory (e.g., flash memory), optical media, magnetic media (e.g., disk or tape), and so forth. In the context of this disclosure, the memory 882 is implemented to store instructions 884, data 886, and other information of the electronic device 802, and thus when configured as or part of a computer-readable storage medium, the memory 882 does not include transitory propagating signals or carrier waves.

The electronic device 802 may also include input/output ports 890. The I/O ports 890 enable data exchanges or interaction with other devices, networks, or users or between components of the device.

The electronic device 802 may further include a signal processor (SP) 892 (e.g., such as a digital signal processor (DSP)). The signal processor 892 may function similar to the processor and may be capable of executing instructions and/or processing information in conjunction with the memory 882.

For communication purposes, the electronic device 802 also includes a modem 894, a wireless transceiver 896, and an antenna (not shown). The wireless transceiver 896 provides connectivity to respective networks and other electronic devices connected therewith using radio-frequency (RF) wireless signals and may include the transceiver circuit 700 of FIG. 7. The wireless transceiver 896 may facilitate communication over any suitable type of wireless network, such as a wireless local area network (WLAN), a peer-to-peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Example Aspects

In addition to the various aspects described above, specific combinations of aspects are within the scope of the disclosure, some of which are detailed in the clauses below:

Clause 1: A surface acoustic wave (SAW) device comprising: a piezoelectric layer and an interdigital transducer (IDT) disposed above the piezoelectric layer and comprising a first electrode having a first busbar and a first plurality of fingers extending from the first busbar, wherein the first electrode comprises: a first copper layer disposed above the piezoelectric layer; a first intermediate layer disposed above the first copper layer, the first intermediate layer comprising a different material than the first copper layer; and a second copper layer disposed above the first intermediate layer.

Clause 2: The SAW device of Clause 1, wherein the first intermediate layer is insoluble to copper.

Clause 3: The SAW device of Clause 1 or 2, wherein the first intermediate layer comprises chromium or chromium silver.

Clause 4: The SAW device of any of the preceding Clauses, wherein the first intermediate layer comprises tantalum, nickel, tungsten, a nitride, or a carbide.

Clause 5: The SAW device of any of the preceding Clauses, wherein a grain size of the first copper layer is at most 120 nm.

Clause 6: The SAW device of any of the preceding Clauses, wherein the first intermediate layer has a thickness of less than 50 nm.

Clause 7: The SAW device of any of the preceding Clauses, wherein the first intermediate layer has a thickness in a range of 0.1 to 5.0 nm.

Clause 8: The SAW device of any of the preceding Clauses, wherein the first intermediate layer is located in a lower portion of the first electrode.

Clause 9: The SAW device of any of the preceding Clauses, further comprising: a second intermediate layer disposed above the second copper layer, the second intermediate layer comprising a different material than the second copper layer; and a third copper layer disposed above the second intermediate layer.

Clause 10: The SAW device of Clause 9, wherein the second intermediate layer comprises a different material than the first intermediate layer.

Clause 11: The SAW device of Clause 9 or 10, wherein at least one of the first intermediate layer or the second intermediate layer has a thickness of less than 50 nm.

Clause 12: The SAW device of any of Clauses 9-11, wherein the second intermediate layer has a thickness in a range of 0.1 to 5.0 nm.

Clause 13: The SAW device of any of Clauses 9-12, wherein a thickness of the third copper layer is greater than a thickness of the first copper layer and a thickness of the second copper layer.

Clause 14: The SAW device of any of the preceding Clauses, wherein the SAW device is a temperature-compensated SAW device.

Clause 15: The SAW device of any of the preceding Clauses, wherein the first electrode further comprises: a silver layer disposed beneath the first copper layer; and an adhesion layer disposed beneath the silver layer.

Clause 16: A plurality of resonators forming a filter circuit, wherein the SAW device of any of the preceding Clauses is a resonator in the plurality of resonators.

Clause 17: A wireless device comprising: a radio frequency (RF) circuit; and a surface acoustic wave (SAW) filter coupled to the RF circuit, the SAW filter comprising: a piezoelectric layer; and an interdigital transducer (IDT) disposed above the piezoelectric layer and comprising a first electrode having a first busbar and a first plurality of fingers extending from the first busbar, wherein the first electrode comprises: a first copper layer disposed above the piezoelectric layer; a first intermediate layer disposed above the first copper layer, the first intermediate layer comprising a different material than the first copper layer; and a second copper layer disposed above the first intermediate layer.

Clause 18: The wireless device of Clause 17, wherein the RF circuit comprises a transmit path and a receive path and wherein the SAW filter forms a portion of a duplexer coupled to an output of the transmit path and to an input of the receive path.

Clause 19: The wireless device of Clause 17 or 18, wherein the RF circuit comprises a low-noise amplifier (LNA) and wherein the SAW filter is coupled to an output of the LNA.

Clause 20: A method of fabricating a surface acoustic wave (SAW) device, the method comprising: forming an interdigital transducer (IDT) above a piezoelectric layer, wherein forming the IDT comprises forming a first electrode of the IDT, the first electrode having a first busbar and a first plurality of fingers extending from the first busbar, and wherein forming the first electrode comprises: forming a first copper layer above the piezoelectric layer; forming a first intermediate layer above the first copper layer, the first intermediate layer comprising a different material than the first copper layer; and forming a second copper layer above the first intermediate layer.

Clause 21: The method of Clause 20, wherein the first intermediate layer is insoluble to copper and has a thickness in a range of 0.1 to 5.0 nm.

Clause 22: The method of Clause 20 or 21, wherein the first intermediate layer comprises chromium or chromium silver.

Clause 23: The method of any of Clauses 20-22, wherein the first intermediate layer comprises tantalum, nickel, tungsten, a nitride, or a carbide.

Clause 24: The method of any of Clauses 20-23, wherein a grain size of the first copper layer is at most 120 nm.

Clause 25: The method of any of Clauses 20-25, wherein forming the first electrode further comprises: forming a second intermediate layer above the second copper layer, the second intermediate layer comprising a different material than the second copper layer; and forming a third copper layer above the second intermediate layer.

Clause 26: The method of Clause 25, wherein the second intermediate layer comprises a different material than the first intermediate layer and has a thickness in a range of 0.1 to 5.0 nm.

Clause 27: The method of Clause 25 or 26, wherein a thickness of the third copper layer is greater than a thickness of the first copper layer and a thickness of the second copper layer.

Clause 30: The method of any of Clauses 20-27, wherein forming the first electrode further comprises: forming an adhesion layer above the piezoelectric layer; and forming a silver layer disposed above the adhesion layer, wherein the first copper layer is formed above the silver layer.

Clause 29: A surface acoustic wave (SAW) device comprising: a piezoelectric layer and an interdigital transducer (IDT) disposed above the piezoelectric layer and comprising a first electrode having a first busbar and a first plurality of fingers extending from the first busbar. The first electrode comprises: a first copper layer disposed above the piezoelectric layer; means for interrupting grain growth in the first copper layer, disposed above the first copper layer; and a second copper layer disposed above the means for interrupting grain growth in the first copper layer.

Clause 30: The SAW device of Clause 29, further comprising: means for interrupting grain growth in the second copper layer, disposed above the second copper layer; and a third copper layer disposed above the means for interrupting grain growth in the second copper layer.

ADDITIONAL CONSIDERATIONS

The various operations of methods described above may be performed by any suitable means capable of performing the corresponding functions. The means may include various hardware and/or software component(s) and/or module (s), including, but not limited to a circuit, an application-specific integrated circuit (ASIC), or processor.

By way of example, an element, or any portion of an element, or any combination of elements described herein may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoCs), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Generally, where there are operations illustrated in figures, those operations may have corresponding counterpart means-plus-function components with similar numbering. For example, means for interrupting grain growth may include an intermediate layer, such as the first intermediate layer 412 illustrated in FIGS. 4A-4C or the second intermediate layer 416 depicted in FIG. 4C.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuit.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c"

is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A surface acoustic wave (SAW) device comprising:
   a piezoelectric layer; and
   an interdigital transducer (IDT) disposed above the piezoelectric layer and comprising a first electrode having a first busbar and a first plurality of fingers extending from the first busbar, wherein the first electrode comprises:
   a first copper layer disposed above the piezoelectric layer;
   a first intermediate layer disposed above the first copper layer, the first intermediate layer comprising a different material than the first copper layer;
   a second copper layer disposed above the first intermediate layer;
   a second intermediate layer disposed above the second copper layer, the second intermediate layer comprising a different material than the second copper layer; and
   a third copper layer disposed above the second intermediate layer.

2. The SAW device of claim 1, wherein the first intermediate layer is insoluble to copper.

3. The SAW device of claim 1, wherein the first intermediate layer comprises chromium or chromium silver.

4. The SAW device of claim 1, wherein the first intermediate layer comprises tantalum, nickel, tungsten, a nitride, or a carbide.

5. The SAW device of claim 1, wherein a grain size of the first copper layer is at most 120 nm.

6. The SAW device of claim 1, wherein the first intermediate layer has a thickness of less than 50 nm.

7. The SAW device of claim 1, wherein the first intermediate layer has a thickness in a range of 0.1 to 5.0 nm.

8. The SAW device of claim 1, wherein the first intermediate layer is located in a lower portion of the first electrode.

9. A plurality of resonators forming a filter circuit, wherein the SAW device of claim 1 is a resonator in the plurality of resonators.

10. The SAW device of claim 1, wherein the second intermediate layer comprises a different material than the first intermediate layer.

11. The SAW device of claim 1, wherein at least one of the first intermediate layer or the second intermediate layer has a thickness of less than 50 nm.

12. The SAW device of claim 1, wherein the second intermediate layer has a thickness in a range of 0.1 to 5.0 nm.

13. The SAW device of claim 1, wherein a thickness of the third copper layer is greater than a thickness of the first copper layer and a thickness of the second copper layer.

14. The SAW device of claim 1, wherein the SAW device is a temperature-compensated SAW device.

15. The SAW device of claim 1, wherein the first electrode further comprises:
   a silver layer disposed beneath the first copper layer; and
   an adhesion layer disposed beneath the silver layer.

16. A wireless device comprising:
   a radio frequency (RF) circuit; and
   a surface acoustic wave (SAW) filter coupled to the RF circuit, the SAW filter comprising:
   a piezoelectric layer; and
   an interdigital transducer (IDT) disposed above the piezoelectric layer and comprising a first electrode having a first busbar and a first plurality of fingers extending from the first busbar, wherein the first electrode comprises:
   a first copper layer disposed above the piezoelectric layer, wherein a grain size of the first copper layer is at most 120 nm;
   a first intermediate layer disposed above the first copper layer, the first intermediate layer comprising a different material than the first copper layer; and
   a second copper layer disposed above the first intermediate layer.

17. The wireless device of claim 16, wherein the RF circuit comprises a low-noise amplifier (LNA) and wherein the SAW filter is coupled to an output of the LNA.

18. The wireless device of claim 16, wherein the RF circuit comprises a transmit path and a receive path and wherein the SAW filter forms a portion of a duplexer coupled to an output of the transmit path and to an input of the receive path.

19. A method of fabricating a surface acoustic wave (SAW) device, the method comprising:
   forming an interdigital transducer (IDT) above a piezoelectric layer, wherein forming the IDT comprises forming a first electrode of the IDT, the first electrode having a first busbar and a first plurality of fingers extending from the first busbar, and wherein forming the first electrode comprises:
   forming a first copper layer above the piezoelectric layer;
   forming a first intermediate layer above the first copper layer, the first intermediate layer comprising a different material than the first copper layer, wherein the first intermediate layer has a thickness in a range of 0.1 to 5.0 nm; and
   forming a second copper layer above the first intermediate layer.

20. The method of claim 19, wherein forming the first electrode further comprises:
   forming an adhesion layer above the piezoelectric layer; and
   forming a silver layer disposed above the adhesion layer, wherein the first copper layer is formed above the silver layer.

21. The method of claim 19, wherein the first intermediate layer is insoluble to copper.

22. The method of claim 19, wherein the first intermediate layer comprises chromium or chromium silver.

23. The method of claim 19, wherein the first intermediate layer comprises tantalum, nickel, tungsten, a nitride, or a carbide.

24. The method of claim 19, wherein a grain size of the first copper layer is at most 120 nm.

25. The method of claim 19, wherein forming the first electrode further comprises:
   forming a second intermediate layer above the second copper layer, the second intermediate layer comprising a different material than the second copper layer; and
   forming a third copper layer above the second intermediate layer.

26. The method of claim 25, wherein the second intermediate layer comprises a different material than the first intermediate layer and has a thickness in a range of 0.1 to 5.0 nm.

27. The method of claim 25, wherein a thickness of the third copper layer is greater than a thickness of the first copper layer and a thickness of the second copper layer.

28. A surface acoustic wave (SAW) device comprising:
   a piezoelectric layer; and
   an interdigital transducer (IDT) disposed above the piezoelectric layer and comprising a first electrode having a first busbar and a first plurality of fingers extending from the first busbar, wherein the first electrode comprises:
      a first copper layer disposed above the piezoelectric layer;
      means for interrupting grain growth in the first copper layer, disposed above the first copper layer;
      a second copper layer disposed above the means for interrupting grain growth in the first copper layer;
      a silver layer disposed beneath the first copper layer; and
      an adhesion layer disposed beneath the silver layer.

29. The SAW device of claim 28, further comprising:
   means for interrupting grain growth in the second copper layer, disposed above the second copper layer; and
   a third copper layer disposed above the means for interrupting grain growth in the second copper layer.

* * * * *